(12) United States Patent
Al-Absi et al.

(10) Patent No.: US 9,553,562 B1
(45) Date of Patent: Jan. 24, 2017

(54) COMPACT C-MULTIPLIER

(71) Applicant: KING FAHD UNIVERSITY OF PETROLEUM AND MINERALS, Dhahran (SA)

(72) Inventors: Munir A. Al-Absi, Dhahran (SA); Eyas Saleh Al-Suhaibani, Dhahran (SA); Muhammad Taher Abuelma'atti, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 15/169,696

(22) Filed: May 31, 2016

(51) Int. Cl.
*G06F 7/24* (2006.01)
*H03H 11/04* (2006.01)

(52) U.S. Cl.
CPC .................................... *H03H 11/04* (2013.01)

(58) Field of Classification Search
CPC .............. G06G 7/20; G06G 7/14; G06G 7/16; H03H 11/04
USPC ............... 327/558, 357, 105, 107, 356, 358, 355,327/360, 361, 346, 347–350, 362, 333, 111,327/335–337
See application file for complete search history.

(56) References Cited

U.S. PATENT DOCUMENTS

| | | | | |
|---|---|---|---|---|
| 6,074,082 | A * | 6/2000 | Gilbert | G06G 7/163 327/356 |
| 8,664,973 | B2 | 3/2014 | Ali et al. | |
| 2005/0007177 | A1* | 1/2005 | Hastings | H03F 1/26 327/346 |
| 2008/0246539 | A1 | 10/2008 | Zadeh | |
| 2012/0081168 | A1* | 4/2012 | Hastings | G06G 7/24 327/346 |
| 2014/0043087 | A1* | 2/2014 | Li | G06G 7/16 327/358 |
| 2016/0006442 | A1 | 1/2016 | Lahiri et al. | |

OTHER PUBLICATIONS

Abuelma'atti et al., "Electronically Tunable Capacitance Multiplier and Frequency-Dependent Negative Resistance Simulator Using the Current-Controlled Current Conveyor," Microelectronics Journal, vol. 30, Issue 9, Sep. 1999, pp. 869-873.

* cited by examiner

*Primary Examiner* — Lincoln Donovan
*Assistant Examiner* — Thomas Skibinski
(74) *Attorney, Agent, or Firm* — Richard C. Litman

(57) ABSTRACT

The compact C-multiplier includes four MOSFETs operating in the subthreshold region using the translinear principle. The multiplier is controllable to meet designer requirements. A Tanner Tspice simulator is used to confirm the functionality of the design in 0.13 pm CMOS Technology. The circuit operates from a ±0.75 supply voltage. Simulation results indicate that the multiplication factor is large compared to existing designs.

15 Claims, 2 Drawing Sheets

COMPACT C-MULTIPLIER

BACKGROUND OF THE INVENTION

1. Field of the Invention

The present invention relates to impedance scaling circuits, and particularly to a compact C-multiplier utilizing MOSFETs in a translinear loop circuit with the MOSFETs biased in weak inversion mode.

2. Description of the Related Art

Integrated circuits are playing an increasing role in implantable biomedical systems. Such circuits must be designed to meet rigorous specification especially size and power consumption. The signals of the body are low in frequency, ranging from 1 Hz or less to 1 KHz. Realization of large time constants in small area is required for integrated active filters, but unfortunately, existing circuits require large power consumption.

Thus, a compact C-multiplier solving the aforementioned problems is desired.

SUMMARY OF THE INVENTION

The compact C-multiplier is a circuit that includes four MOSFETs operating in the subthreshold region using the translinear principle. The multiplier is controllable to meet designer requirements. A Tanner Tspice simulator is used to confirm the functionality of the design in 0.13 pm CMOS Technology. The circuit operates from a ±0.75 supply voltage. Simulation results indicate that the multiplication factor is large compared to existing designs.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The compact C-multiplier is a circuit that includes four MOSFETs operating in the subthreshold region using the translinear principle. The multiplier is controllable to meet designer requirements. A Tanner Tspice simulator is used to confirm the functionality of the design in 0.13 pm CMOS Technology. The circuit operates from a ±0.75 supply voltage. Simulation results indicate that the multiplication factor is large compared to existing designs.

Figure 1:
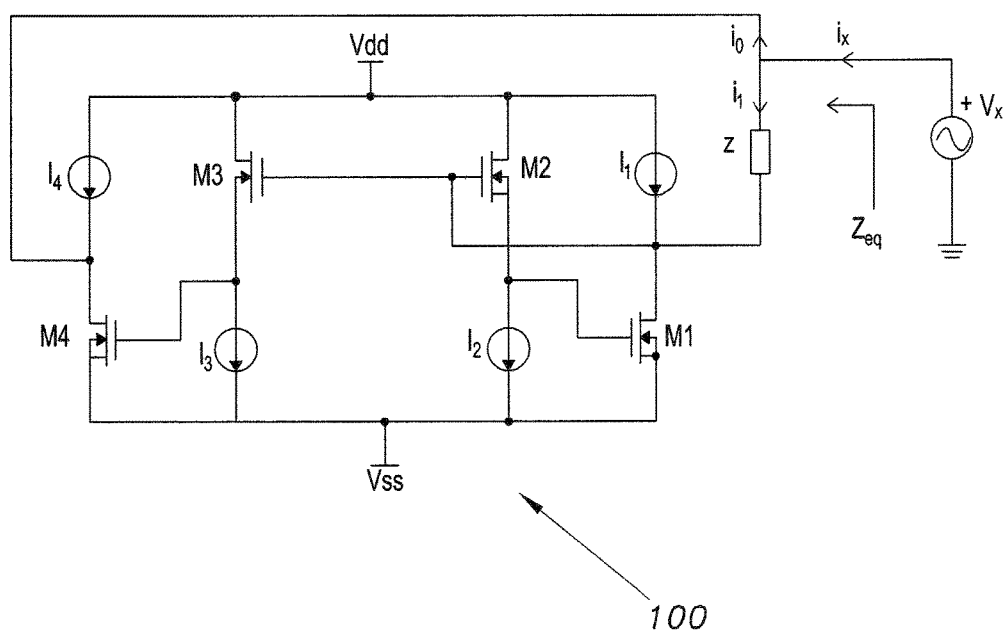
FIG. 1 is a circuit diagram of a compact C-multiplier according to the present invention.

As shown in FIG. 1, four identical MOSFET transistors form a translinear loop. All transistors are biased in weak inversion. The source terminal of the first MOSFET M1 is connected to the source terminal of the fourth MOSFET M4. The gate terminal of the first MOSFET M1 is connected to the source terminal of the second MOSFET M2. The drain terminal of the first MOSFET M1 is connected to the gate terminal of the second MOSFET M2. The gate terminal of the second MOSFET M2 is connected to the gate terminal of the third MOSFET M3. The drain terminal of the second MOSFET M2 is connected to the drain terminal of the third MOSFET M3. A first current source $I_1$ has a first terminal and a second terminal, the first $I_1$ terminal being connected to the drain terminal of the second MOSFET M2, the second $I_1$ terminal being connected to the drain terminal of the first MOSFET M1. A second current source $I_2$ has a first terminal and a second terminal, the first $I_2$ terminal being connected to the gate terminal of the first MOSFET M1, the second $I_2$ terminal being connected to the source terminal of the first MOSFET M1.

A third current source $I_3$ has a first terminal and a second terminal, the first $I_3$ terminal being connected to the gate terminal of the fourth MOSFET M4, the second $I_3$ terminal being connected to the source terminal of the fourth MOSFET M4. A fourth current source $I_4$ has a first terminal and a second terminal, the first $I_4$ terminal being connected to the drain terminal of the third MOSFET M3, the second $I_4$ terminal being connected to the drain terminal of the fourth MOSFET M4.

An impedance Z (e.g., a floating capacitor) is connected between the drain terminal of the first MOSFET M1 and the drain terminal of the fourth MOSFET M4. The M3 drain terminal and the M2 drain terminal are connected to a drain voltage source $V_{dd}$. The M4 source terminal and the M1 source terminal are connected to a source voltage source $V_{ss}$.

The circuit functions as a scalar for the impedance Z.

With reference to FIG. 1, applying KVL (Kirchhoffs Voltage Law) to the translinear loop yields:

$$V_{GS1}+V_{GS2}=V_{GS3}+V_{GS4}. \quad (1)$$

The drain current of an NMOS operating in subthreshold is given by:

$$I_D = \frac{W}{L}I_{D0}e^{\left(\frac{V_{GS}-V_{Th}}{nV_T}\right)} \quad (2)$$

where $I_{D0}$ is the saturation current, n is the slop factor, and $V_T$ is the thermal voltage.

From Eq. (2) the gate to source voltage is given by:

$$V_{GS} = nV_T\ln\left(\frac{I_D}{I_{D0}}\frac{L}{W}\right)+V_{Th}. \quad (3)$$

Combining Eqs. (3) and (1) yields:

$$I_{D1}I_{D2}=I_{D3}I_{D4}. \quad (4)$$

To find the equivalent impedance seen from point x, an AC voltage source is applied and the AC currents $i_1$ and $i_0$ are included in the analysis. Thus, Eq. (4) can be rewritten as:

$$(i_0+I_4)*I_3=I_2*(I_1+i_1). \quad (5)$$

Equation (5) can be written as:

$$(i_0+I_4)=G*(I_1+i_1). \quad (6)$$

where $G=I_2/I_3$. If $I_4=G*I_1$, then $i_0=G*i_1$.

With reference to FIG. 1, the impedance $Z_{eq}$ is given by:

$$Z_{eq} = \frac{v_x}{i_x} = \frac{v_x}{i_1+i_0} = \frac{v_x}{i_1+Gi_1} = \frac{v}{i_1}\frac{1}{(G+1)}. \quad (7)$$

But $(v_x/i_1) \approx Z$ because Z will be much greater than the impedance in series with it (which is close to 1/gm), so that Eq. (7) can be written as:

$$Z_{eq} = Z \frac{1}{(G+1)}. \qquad (8)$$

It is evident from Eq. (8) that the circuit is an impedance scalar.

If Z is a capacitor, where 1/sC is the value of the capacitor in Laplace transform format, then scale up is achieved with:

$$Z_{eq} = \frac{1}{sC} \frac{1}{(G+1)}. \qquad (9)$$

From Eq. (9) a capacitance multiplier is achieved and the multiplication factor is controlled using the bias currents $I_2$ and $I_3$.

The proposed circuit was simulated using Tanner Tspice in 0.18 μm CMOS process. The aspect ratio of all transistors is 10 μm/3.5 μm, and the circuit is powered using ±0.75V. The currents $I_1$ and $I_3$ are set to 10 nA, and the capacitor to be multiplied is 3 pF. The current $I_2$ is swept from 10 nA to 10 μA, corresponding to a multiplication factor from 1 to 1,000 times. To find the value of the effective capacitance, the circuit is configured as a low pass filter using 1 MΩ resistance in series with the C-multiplier. Then, by measuring the −3 dB of the filter for each value of $I_2$, the value of the effective capacitance is calculated and plotted against the expected capacitance.

Figure 2:
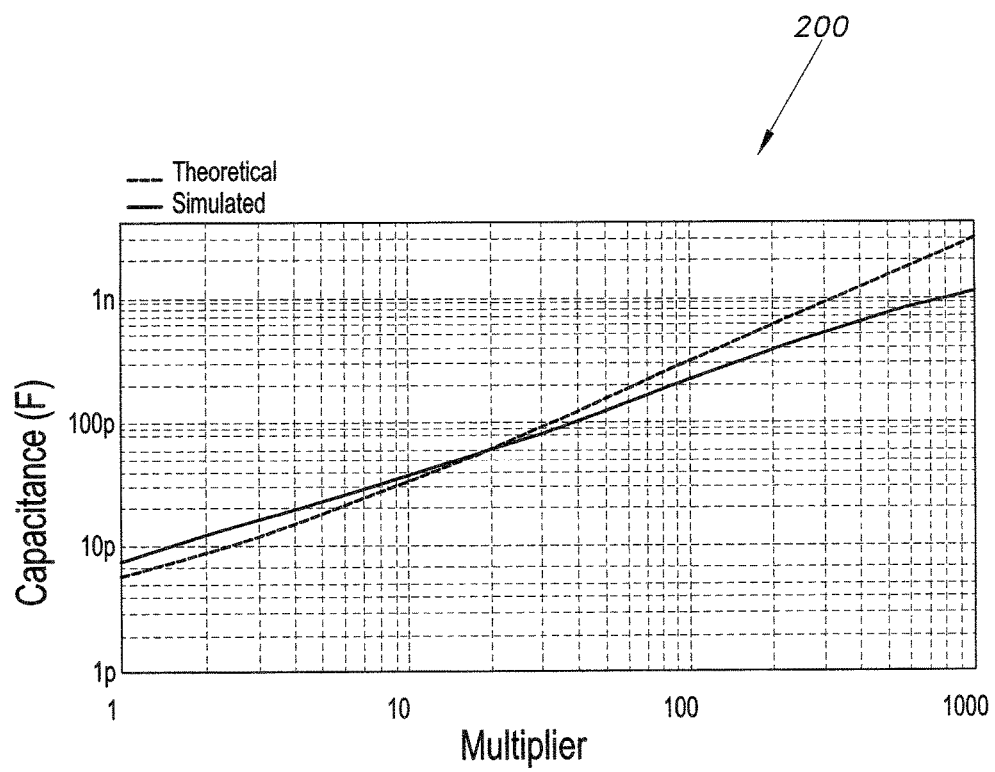
FIG. 2 is a plot showing simulated and calculated results of the C-multiplier of FIG. 1.

The simulation results shown in FIG. 2 indicate that the proposed circuit is functioning properly with some deviation from the theoretical result. As can be seen from plot 200 of FIG. 2, there is a deviation between calculated and simulated result. This may be attributed to the effect of the parasitic capacitances. The proposed design can be used in integrated circuit design where large time constants are required.

It is to be understood that the present invention is not limited to the embodiments described above, but encompasses any and all embodiments within the scope of the following claims.

We claim:

1. A compact C-multiplier, comprising:
   first M1, second M2, third M3 and fourth M4 MOSFETs connected together to form a translinear loop circuit, the translinear loop circuit, the MOSFETs having bias circuits constraining operation of the MOSFETs to a weak inversion mode; and
   a capacitor C connected to the translinear loop circuit to form a capacitive impedance $Z_{eq}$;
   wherein the capacitive impedance $Z_{eq}$ is characterized by the relation:

$$Z_{eq} = \frac{1}{sC} \frac{1}{(G+1)},$$

where 1/sC is the value of the capacitor in Laplace transform format, and G is gain defined by current ratios of the translinear loop circuit.

2. The compact C-multiplier according to claim 1, wherein each of the MOSFETs has an aspect ratio defined by (W/L)=10 μm/3.5 μm.

3. The compact C-multiplier according to claim 1, wherein the first MOSFET M1 has a source terminal connected to the source terminal of the fourth MOSFET M4.

4. The compact C-multiplier according to claim 3, wherein the first MOSFET M1 has a gate terminal connected to the source terminal of the second MOSFET M2.

5. The compact C-multiplier according to claim 4, wherein the first MOSFET M1 has a drain terminal connected to the gate terminal of the second MOSFET M2.

6. The compact C-multiplier according to claim 5, wherein the gate terminal of the second MOSFET M2 is connected to the gate terminal of the third MOSFET M3.

7. The compact C-multiplier according to claim 6, wherein the second MOSFET M2 has a drain terminal connected to the drain terminal of the third MOSFET M3.

8. The compact C-multiplier according to claim 7, further comprising a first current source $I_1$ having a first terminal and a second terminal, the first $I_1$ terminal being connected to the drain terminal of the second MOSFET M2, the second $I_1$ terminal being connected to the drain terminal of the first MOSFET M1.

9. The compact C-multiplier according to claim 8, further comprising a second current source $I_2$ having a first terminal and a second terminal, the first $I_2$ terminal being connected to the gate terminal of the first MOSFET M1, the second $I_2$ terminal being connected to the source terminal of the first MOSFET M1.

10. The compact C-multiplier according to claim 9, further comprising a third current source $I_3$ having a first terminal and a second terminal, the first $I_3$ terminal being connected to the gate terminal of the fourth MOSFET M4, the second $I_3$ terminal being connected to the source terminal of the fourth MOSFET M4.

11. The compact C-multiplier according to claim 10, further comprising a fourth current source $I_4$ having a first terminal and a second terminal, the first $I_4$ terminal being connected to the drain terminal of the third MOSFET M3, the second $I_4$ terminal being connected to the drain terminal of the fourth MOSFET M4.

12. The compact C-multiplier according to claim 11, wherein the capacitor C is connected between the drain terminal of the first MOSFET M1 and the drain terminal of the fourth MOSFET M4.

13. The compact C-multiplier according to claim 12, wherein the M3 drain terminal and the M2 drain terminal are connected to a drain voltage source $V_{dd}$.

14. The compact C-multiplier according to claim 13, wherein the M4 source terminal and the M1 source terminal are connected to a source voltage source $V_{ss}$.

15. The compact C-multiplier according to claim 14, wherein the current ratios defining the gain G are characterized by the relation:

$$G = \frac{I_2}{I_3},$$

where $I_2$ is the current of the second current source and $I_3$ is the current of the third current source.

* * * * *